(12) United States Patent
Escalera et al.

(10) Patent No.: US 6,653,910 B2
(45) Date of Patent: Nov. 25, 2003

(54) SPIRAL BALUN

(75) Inventors: Nestor J. Escalera, Gilbert, AZ (US); Rudy M. Emrick, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 27 days.

(21) Appl. No.: 10/027,515

(22) Filed: Dec. 21, 2001

(65) Prior Publication Data

US 2003/0117227 A1 Jun. 26, 2003

(51) Int. Cl.[7] .............................................. H03H 7/42
(52) U.S. Cl. ............................. 333/26; 333/25; 455/326
(58) Field of Search .............................. 333/26, 25, 119, 333/24 R; 455/326

(56) References Cited

U.S. PATENT DOCUMENTS

| | | | | |
|---|---|---|---|---|
| 4,816,784 A | * | 3/1989 | Rabjohn ................... | 333/24 R |
| 5,428,839 A | * | 6/1995 | Friesen et al. .............. | 455/326 |
| 5,477,204 A | * | 12/1995 | Li ............................... | 336/200 |
| 5,818,308 A | * | 10/1998 | Tanaka et al. .............. | 333/116 |
| 6,097,273 A | | 8/2000 | Frye et al. | |

FOREIGN PATENT DOCUMENTS

| | | |
|---|---|---|
| JP | 9139315 | 9/1997 |
| WO | WO 99/57818 | 11/1999 |

OTHER PUBLICATIONS

Ang et al., "A compact MMIC balun using spiral transformers," 1999 Asia Pacific Microwave Conference Proceedings, IEEE, vol. 3, pp. 655–658.

Gokdemir et al., "Design and performance of GaAs MMIC CPW baluns using overlaid and spiral couplers," 1997 IEEE Microwave Symposium Digest, pp. 4041–4404.

* cited by examiner

*Primary Examiner*—Robert Pascal
*Assistant Examiner*—Dean Takaoka
(74) *Attorney, Agent, or Firm*—Douglas W. Gilmore; William E. Koch

(57) ABSTRACT

A monolithically integrable spiral balun comprises a substrate having first, second, third, and fourth transmission lines formed thereon. The first transmission line has a first end coupled to receive an input signal and has a second end. The first transmission line forms a spiral that winds in a first direction from its first end to its second end. The second transmission line has a first end and has a second end electrically coupled to the second end of the first transmission line. The second transmission line forms a second spiral that winds in a second direction from its first end to its second end. The third transmission line has a first end for providing a first output and a second end for coupling to a first potential. The third transmission line forms a third spiral that interleaves the first spiral and winds in the second direction from its first end to its second end. A fourth transmission line has a first end for providing a second output and a second end for coupling to a second potential. The fourth transmission line forms a fourth spiral that interleaves the second transmission line and winds in the first direction from its first end to its second end.

13 Claims, 1 Drawing Sheet ized hybrid couplers, transformers, or baluns to achieve

SPIRAL BALUN

TECHNICAL FIELD

This invention relates generally to spiral baluns, and more particularly to a monolithically integrable and compact spiral balun that occupies less substrate area without a degradation in performance.

BACKGROUND OF THE INVENTION

Circuits such as balanced mixers have traditionally utilized hybrid couplers, transformers, or baluns to achieve equal amplitude division and phase differential at the inputs of non-linear devices such as diodes, field-effect-transistors, etc. For example, a balun is utilized to provide balanced outputs from and unbalanced input, and for wireless applications, this requires (1) half the input signal amplitude at each of two outputs 180 degrees out of phase with each other and (2) very high frequency operation and low power consumption. While in principle, transformers can provide the required output signals, they are generally wire-wound devices that are frequency limited. Active baluns meet the frequency requirements but are generally characterized by high power consumption. Passive baluns, however, meet both requirements; i.e. high frequency at low power. A known Marchand balun comprises three transmission lines that are formed of a conductive material, preferably a deposited metal. An unbalanced input signal is applied to an input terminal at one end of a first transmission line, the other end of which is open; i.e. an open circuit or high impedance output. First ends of the second and third transmission lines are typically grounded, and second ends of the second and third transmission lines are coupled respectively to provide output signals that are substantially equal in amplitude and approximately 180 degrees out of phase with each other at a desired frequency. The balun is realized by two coupled line sections having an electrical length that is preferably approximately 90 degrees at the frequency of interest. In this case, "coupled" refers broadly to placing two unshielded transmission lines in close proximity such that RF power can be transmitted between the lines due to the interaction of the electromagnetic fields of each transmission line. Coupled transmission lines often consist of three conductors (i.e. two transmission lines, plus a grounded plane) in close proximity, although more conductors could be used. Unfortunately, this design consumes a significant amount of die area when fabricated in monolithic form. This is unacceptable in the case of, for example, a mobile communication application where portability is stressed and downsizing of components and integrated circuits is required.

In view of the foregoing, it should be appreciated that it would be desirable to provide a compact, spiral balun for use in, for example, a double balanced, spiral balun mixer, which occupies less die area and therefore reduces cost without sacrificing performance. Additional desirable features will become apparent to one skilled in the art from the foregoing background of the invention and the following detailed description of a preferred exemplary embodiment and the appended claims.

SUMMARY OF THE INVENTION

In accordance with the teachings of the present invention, there is provided a spiral balun which includes first, second and third transmission lines on a substrate. The first transmission line has a first end coupled to receive an input signal and has a second end, the first transmission line having a first section proximate the first end forming a spiral in a first direction and a second section proximate the second end forming a spiral in a second direction. The second transmission line has a first end for providing a first output and a second end for coupling to a first potential. The second transmission line forms a spiral that interleaves the first section of the first transmission line and forms a spiral that winds in the second direction from its first end to its second end. Third transmission line has a first end for providing a second output and a second end coupled to a second potential. The third transmission line forms a spiral that interleaves the second section of the first transmission line and winds in the first direction from its first end to its second end.

BRIEF DESCRIPTION OF THE DRAWINGS

The present invention hereinafter will be described in conjunction with the accompanying drawings, wherein like numerals denote like elements, in which.

DESCRIPTION OF A PREFERRED EXEMPLARY EMBODIMENT

Figure 1:
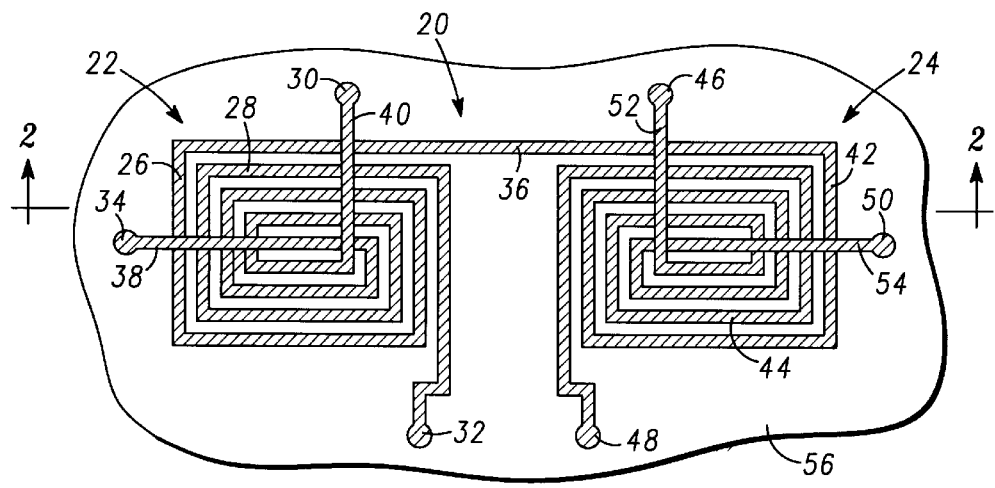
FIG. 1 in a plan view illustrating the layout of the inventive spiral balun.

The following detailed description of a preferred embodiment of the invention is exemplary in nature and is not intended to limit the invention or the application or use thereof. Referring to FIG. 1, there is shown a monolithic spiral balun device layout 20 including a first spiral 22 and a second spiral 24. Spiral 22 includes two coupled transmission lines 26 and 28 which form concentric rectangular spirals wound in an interleaved fashion in opposite directions. That is, from terminal 30 to output terminal 32, transmission line 28 is wound in a clockwise manner, and from transmission line 36 to input terminal 34, transmission line 26 is wound in a counterclockwise direction. While transmission lines 26 and 28 are shown as being wound into generally rectangular shapes, it should be understood that they could be wound to form other shapes (i.e. circular, triangular, etc.). Input terminal 34 is electrically coupled to transmission line 26 at the center of spiral 22 by air-bridge 38. Similarly, transmission line 28 is coupled near the center of spiral 22 to terminal 30 by means of air-bridge 40. Terminal 30 may be coupled to a source of potential (e.g., ground) or to other signals as required by the specific application. Transmission line 26 extends to the outer periphery of spiral 22 and is electrically coupled to the outer periphery of spiral 24 through transmission line 36.

Spiral 24 is likewise comprised of two coupled transmission lines 42 and 44 which form concentric rectangular spirals would in an interleaved fashion in opposite directions. From terminal 46, transmission line 44 is wound in a counter-clockwise direction until it reaches output terminal 48, and from transmission line 36 to high impedance terminal 50, transmission line 42 is wound in a clockwise direction. Transmission line 44 is coupled to terminal 46 by means of air-bridge 52, and transmission line 42 is coupled to high impedance terminal 50 by air-bridge 54. Terminal 46 may be coupled to a source of potential (e.g. ground) or to other signals required by the specific application. The output signals appearing at output terminals 32 and 48 are substantially equal in amplitude and approximately 180 degrees out of phase at a desired frequency. While terminal 34 is shown as being coupled to terminal 50 by three transmission lines 26, 36, and 42, it should be clear that these transmission lines could be combined into a single transmission line.

The dimensions of the spirals are determined by specific application requirements as, for example, the required frequency performance. As an example, the width of the transmission line could be 10 microns with a 10 micron spacing therebetween.

Figure 2:
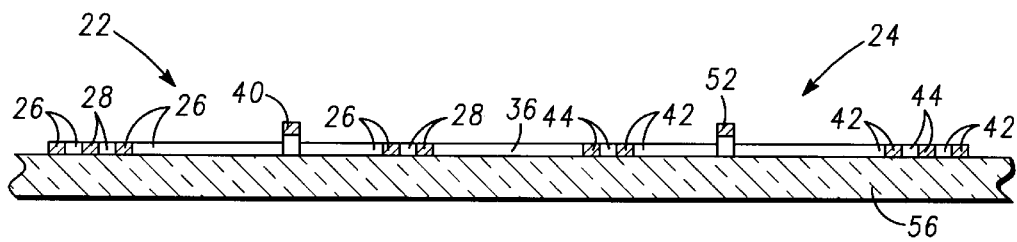
FIG. 2 is a cross sectional view of the inventive spiral balun shown in FIG. 1 taken along line A—A.

FIG. 2 is a cross-sectional view of the inventive spiral balun shown in FIG. 1 taken along line A—A. As can be seen, a substrate 56 (e.g. a suitable thin film base material such as glass, ceramic, an insulator such as SIO2, or a semiconductor such as silicon or gallium arsenide) is provided. Transmission lines 26, 28, 36, 42, and 44 are formed on substrate 56 by depositing a conductive layer (e.g. aluminum) thereon and patterning the conductive layer using standard lithography techniques to form spirals 22 and 24. The thickness of the conductive layer is typically in the range of 1–5 microns. It should be appreciated that since all of the transmission lines are etched from a single conductive layer and are therefore coplanar, the manufacture of the inventive spiral balun is simple and therefore less costly. Furthermore, since the inventive spiral balun requires significantly less space on a die, it enables the design of smaller integrated circuits which in turn promote a higher yield (i.e. more parts per wafer). This results in a lower per-part cost since wafer costs are essentially fixed, and a lower performance component may be replaced with a higher performance part occupying an equal or smaller die area.

Figure 3:
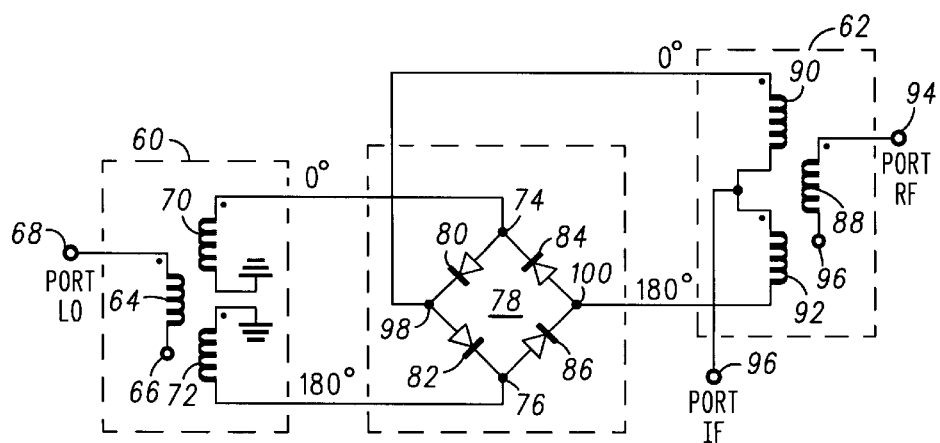
FIG. 3 is a schematic diagram of a double balanced mixer including two of the spiral baluns shown and described in connection with FIG. 1 and FIG. 2.

FIG. 3 is a schematic diagram of a double balanced mixer utilizing first and second spiral baluns 60 and 62 respectively, each of the types shown and described in connection with FIG. 1 and FIG. 2. For example, spiral balun 60 includes a first coil 64 that corresponds to transmission lines 26, 36, and 42 in FIG. 1. As can be seen, coil 64 has a first open or high impedance end 66 and a second end coupled to the output of a local oscillator at input terminal 68. Coils 70 and 72 (corresponding to transmission lines 28 and 44 respectively in FIG. 1) each have a first end coupled to ground and each have a second end at which signals are produced which are substantially equal in amplitude but 180 degrees out of phase. These outputs are coupled respectively to points 74 and 76 of diode ring 78, which comprises diodes 80, 82, 84, and 86. That is, the zero degree output of coil 70 is coupled to the junction of the cathode of diode 84 and anode of diode 80. The 180-degree output of coil 72 is coupled to point 76; i.e. the junction between the cathode of diode 82 and the anode of diode 86. Diode ring 78 functions in the well-known manner and further description at this time is not necessary.

Spiral balun 62 includes a first coil 88, which corresponds to transmission lines 26, 36, and 42 in FIG. 1. As can be seen, coil 88 has a first open or high impedance end 96 and a second end coupled to RF terminal 94. Coils 90 and 92 (corresponding to transmission lines 28 and 44 in FIG. 1) each have a first end coupled together and to IF terminal 96, and each have a second end at which signals are produced which are substantially equal in amplitude but 180 degrees out of phase. These outputs are coupled respectively to points 98 and 100 of diode ring 78. That is, the zero-degree output of coil 90 is coupled to the junction of the cathode of diode 80 and anode of diode of 82. The 180 output of coil 92 is coupled to point 100; i.e. the junction between the cathode of diode 86 and the anode of diode 84. A local oscillator signal is applied to input terminal 68, and an RF signal is applied to RF terminal 94. These differential signals produced by spiral balun 60 are applied to terminals 74 and 76 in diode ring 78. Similarly, the differential signals produced by spiral balun 62 are applied to terminals 98 and 100 in diode ring 78. While a diode ring 78 has been utilized in the circuit shown in FIG. 3, it should be appreciated that at least one anti-parallel diode pair could be substituted for diode ring 78.

The double-balanced mixer operates in the well-known manner. Suffice it to say that by applying a local oscillator signal (e.g. 26.4 GHz) to terminal 68 and an RF signal (e.g. 27.5 GHz) to terminal 94, the mixer operates as a down converter to produce an intermediate frequency signal (e.g. 1.2 GHz) at IF terminal 96. Similarly, a desired RF signal can be produced at RF terminal 94 by applying an appropriate intermediate frequency signal to IF terminal 96.

Thus, there has been provided a monolithically integrable compact spiral balun that is compact and occupies less die area and results in lower cost without performance degradation. It is therefore especially useful in integrated circuits where miniaturization is a goal.

While a preferred exemplary embodiment has been presented in the foregoing detailed description, it should be appreciated that a vast number of variations in the embodiment exist. The above description is given by way of example only. Changes in form and detail may be made by one skilled in the art without departing from the spirit and scope of the invention as defined in the appended claims.

What is claimed is:

1. A spiral balun, comprising:

a substrate;

a first transmission line on said substrate having a first end suitably adapted to receive a first input and a second end suitably adapted to provide a first output;

a second transmission line on said substrate having a third end suitably adapted to receive a second input signal and a fourth end suitably adapted to provide a second output signal; and a third transmission line on said substrate having a fifth end suitably adapted to receive a third input signal and a sixth end suitably adapted to provide a third output signal;

said first transmission line comprising a first section proximate said first end and forming a first spiral in a first direction;

said first transmission line further comprising a second section proximate said second end and forming a second spiral in a second direction;

said first section of said first transmission line and said second section of said first transmission line connected via a substantially unitary unwound segment of said first transmission line;

said first section of said first transmission line having at least one of a point, a line and a plane of symmetry with respect to said second section of said first transmission line;

said second transmission line forming a third spiral substantially interleaved with said first section of said first transmission line in a third direction; and said third transmission line forming a fourth spiral substantially interleaved with said second section of said first transmission line in a fourth direction.

2. A spiral balun according to claim 1 wherein at least one of said first, second, third, and fourth spirals are generally rectangular.

3. A spiral balun according to claim 1 wherein at least one of said first, said second, said third, and said fourth spirals are generally circular.

4. A spiral balun according to claim 1 wherein said first direction, said second direction and said third direction are clockwise and said fourth direction is counterclockwise.

5. A spiral balun according to claim 4 wherein said second end of said first transmission line is open.

6. A spiral balun according to claim 4 wherein said second end of said first transmission line is coupled to a high impedance.

7. A spiral balun according to claim 4 wherein said second output and said third output have substantially equal amplitudes.

8. A spiral balun according to claim 7 wherein said second output and said third output are substantially 180 degrees out of phase.

9. A spiral balun according to claim 8 wherein said substrate is at least one of a dielectric and a semiconductor substrate.

10. A balanced-mixer having a first terminal, a second terminal, and having an input terminal for receiving a reference signal, comprising:
   a substrate;
   at least one anti-parallel diode pair formed on said substrate;
   a first spiral balun, comprising:
      a first transmission line on said substrate having a first end suitably adapted to receive a reference signal and a second end;
      a second transmission line on said substrate having a third end suitably coupled to said at least one anti-parallel diode pair and a fourth end suitably coupled to a first potential; and
      a third transmission line on said substrate having a fifth end suitably coupled to said at least one anti-parallel diode pair and a sixth end suitably coupled to a second potential;
      said first transmission line comprising a first section proximate said first end and forming a first spiral in a first direction;
      said first transmission line further comprising a second section proximate said second end and forming a second spiral in a second direction;
      said first section of said first transmission line and said second section of said first transmission line connected via a substantially unitary unwound segment of said first transmission line;
      said first section of said first transmission line having at least one of a point, a line and a plane of symmetry with respect to said second section of said first transmission line;
      said second transmission line forming a third spiral substantially interleaved with said first section of said first transmission line in a third direction; and
      said third transmission line forming a fourth spiral substantially interleaved with said second section of said first transmission line in a fourth direction
   a second spiral balun comprising:
      a fourth transmission line on said substrate having a seventh end suitably coupled to said first terminal and an eighth end;
      a fifth transmission line on said substrate having a ninth end suitably coupled to said at least one anti-parallel diode pair and a tenth end suitably coupled to said second terminal; and
      a sixth transmission line on said substrate having a eleventh end suitably coupled to said at least one anti-parallel diode pair and a twelfth end suitably coupled to said second terminal;
      said fourth transmission line comprising a third section proximate said seventh end and forming a fifth spiral in a fifth direction;
      said fourth transmission line further comprising a fourth section proximate said eighth end and forming a sixth spiral in sixth direction;
      said third section of said fourth transmission line and said fourth section of said fourth transmission line connected via a substantially unitary unwound segment of said fourth transmission line;
      said third section of said fourth transmission line having at least one of a point, a line and a plane of symmetry with respect to said fourth section of said fourth transmission line;
      said fifth transmission line forming a seventh spiral substantially interleaved with said third section of said fourth transmission line in a seventh direction; and
      said sixth transmission line forming a eighth spiral substantially interleaved with said fourth section of said fourth transmission line in an eighth direction.

11. A balanced mixer according to claim 10 wherein said first terminal is an RF terminal.

12. A balanced mixer according to claim 11 wherein said first terminal is an IF terminal.

13. A balanced mixer according to claim 12 wherein said at least one anti-parallel diode pair comprises a diode ring.

* * * * *